(12) United States Patent
Su et al.

(10) Patent No.: US 9,972,493 B2
(45) Date of Patent: May 15, 2018

(54) METHOD OF FORMING LOW HEIGHT SPLIT GATE MEMORY CELLS

(71) Applicant: Silicon Storage Technology, Inc., San Jose, CA (US)

(72) Inventors: Chien-Sheng Su, Saratoga, CA (US); Jeng-Wei Yang, Zhubei (TW); Man-Tang Wu, Xinpu Township (TW); Chun-Ming Chen, New Taipei (TW); Hieu Van Tran, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days. days.

(21) Appl. No.: 15/594,883

(22) Filed: May 15, 2017

(65) Prior Publication Data

US 2018/0040482 A1   Feb. 8, 2018

Related U.S. Application Data

(60) Provisional application No. 62/372,247, filed on Aug. 8, 2016.

(51) Int. Cl.
| | |
|---|---|
| *H01L 21/336* | (2006.01) |
| *H01L 21/28* | (2006.01) |
| *H01L 21/306* | (2006.01) |
| *G11C 16/04* | (2006.01) |
| *H01L 29/772* | (2006.01) |
| *H01L 29/423* | (2006.01) |

(52) U.S. Cl.
CPC .......... *H01L 21/28* (2013.01); *G11C 16/0425* (2013.01); *H01L 21/28273* (2013.01); *H01L 21/30604* (2013.01); *H01L 29/42328* (2013.01); *H01L 29/772* (2013.01)

(58) Field of Classification Search
CPC ............... H01L 21/28; H01L 21/28273; G11C 16/0425
USPC ....... 365/185.01, 185.05; 438/260, 261, 283, 438/287, 288
See application file for complete search history.

(56) References Cited

U.S. PATENT DOCUMENTS

| 5,029,130 A | 7/1991 | Yeh | |
|---|---|---|---|
| 6,258,668 B1 * | 7/2001 | Lee | .................... G11C 16/0491 |
| | | | 257/E21.682 |
| 6,894,339 B2 | 5/2005 | Fan | |

(Continued)

*Primary Examiner* — Vu Le
(74) *Attorney, Agent, or Firm* — DLA Piper LLP (US)

(57) ABSTRACT

A method of forming a memory device that includes forming a first insulation layer on a semiconductor substrate, forming a conductive material layer on the first insulation layer, forming an insulation block on the conductive material layer, forming an insulation spacer along a side surface of the insulation block and on the conductive material layer, etching the conductive material layer to form a block of the conductive material disposed directly under the insulation block and the insulation spacer, removing the insulation spacer, forming a second insulation layer having a first portion wrapping around an exposed upper edge of the block of the conductive material and a second portion disposed on a first portion of the first insulation layer over the substrate, and forming a conductive block insulated from the block of the conductive material by the second insulation layer and from the substrate by the first and second insulation layers.

11 Claims, 10 Drawing Sheets

(56) References Cited

U.S. PATENT DOCUMENTS

| | | | |
|---|---|---|---|
| 7,205,194 B2* | 4/2007 | Lee | H01L 21/28273 |
| | | | 257/129 |
| 7,242,051 B2 | 7/2007 | Widjaja | |
| 7,247,907 B2* | 7/2007 | Gao | G11C 16/0483 |
| | | | 257/315 |
| 9,276,005 B1 | 3/2016 | Zhou et al. | |
| 2016/0211250 A1 | 7/2016 | Langheinrich | |

* cited by examiner

METHOD OF FORMING LOW HEIGHT SPLIT GATE MEMORY CELLS

RELATED APPLICATIONS

This application claims the benefit of U.S. Provisional Application No. 62/372,247, filed Aug. 8, 2016, and which is incorporated herein by reference.

FIELD OF THE INVENTION

The present invention relates to non-volatile memory cells, and more particularly to a method of forming such cells.

BACKGROUND OF THE INVENTION

Split-gate type memory cell arrays are known. For example, U.S. Pat. No. 5,029,130, which is incorporated herein by reference for all purposes, discloses a split gate memory cell, and its formation, which includes forming source and drain regions in the substrate with a channel region there between, a floating gate over one portion of the channel region, and the control gate over the other portion of the channel region, where the control gate extends up and over the floating gate.

It is also known to form logic devices on the same wafer as the split-gate memory cell array. See for example U.S. Pat. No. 9,276,005, which is incorporated herein by reference for all purposes. However, as device critical dimensions shrink, it becomes more difficult the shrink the height of the split gate memory cell to match the height of the logic devices, especially for those memory cell configurations where the control gate extends up and over the floating gate. There is a further need to reduce the height of the memory cells to better match the low profile of logic devices, and to accommodate multiple metal lines for the memory array and logic devices with tight design rules.

BRIEF SUMMARY OF THE INVENTION

The aforementioned problems and needs are addressed by a method of forming a memory device that includes forming a first insulation layer on a semiconductor substrate; forming a layer of conductive material on the first insulation layer; forming an insulation block on the layer of conductive material; forming an insulation spacer along a side surface of the insulation block and on the layer of conductive material; etching the layer of conductive material to form a block of the conductive material disposed directly under the insulation block and the insulation spacer; removing the insulation spacer, leaving exposed a portion of a top surface and an upper edge of the block of the conductive material; forming a second insulation layer having a first portion wrapping around the exposed upper edge of the block of the conductive material and a second portion disposed on a first portion of the first insulation layer laterally adjacent to the block of the conductive material; forming a conductive block having a first portion disposed over the second insulation layer second portion and the first insulation layer, and a second portion that extends up and over the block of the conductive material, wherein the conductive block first portion is laterally adjacent to and insulated from the block of the conductive material, and wherein the conductive block extends along the first portion of the second insulation layer; and forming spaced apart source and drain regions in the semiconductor substrate, with a channel region extending there between, wherein the block of the conductive material is disposed over a first portion of the channel region and the source region, and wherein the first portion of the conductive block is disposed over a second portion of the channel region and insulated therefrom by the first insulation layer and the second insulation layer.

Other objects and features of the present invention will become apparent by a review of the specification, claims and appended figures.

DETAILED DESCRIPTION OF THE INVENTION

The present invention is a new technique for forming a memory array that significantly reduces memory cell height. This technique maintains the control gate wrap-around (i.e. the control gate still extends up and over the floating gate, wrapping around a corner edge of the floating gate for high erase efficiency), and a thicker control gate oxide relative to the tunnel oxide so that a higher voltage can be applied to the control gate for better erase performance.

Figure 1:
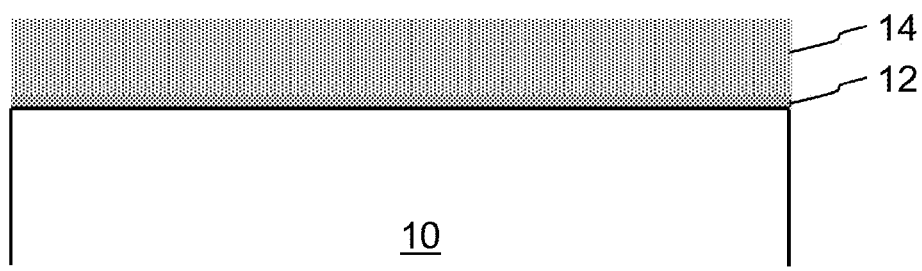
FIGS. 1-18 are side cross sectional views illustrating the steps in the formation of the memory cell of the present invention.

FIGS. 1-18 illustrate the steps in forming the memory array on a substrate on which a logic device is also formed. While one memory cell is shown, it should be appreciated that an array of such memory cells are formed on the same substrate. The process begins with a layer of silicon dioxide 12 (FG oxide) formed on a wafer semiconductor substrate 10, and a layer of polysilicon 14 (FG poly) formed on oxide 12, as shown in FIG. 1. A poly implant and anneal are then performed. The oxide 12 can be approximately 90 Å thick, and the poly 14 can be approximately 200-300 Å thick (which is significantly thinner than a conventional floating gate poly layer). The thin poly 14 not only leads to a reduction in cell height, but also improves the word line—floating gate coupling efficiency.

Figure 2:
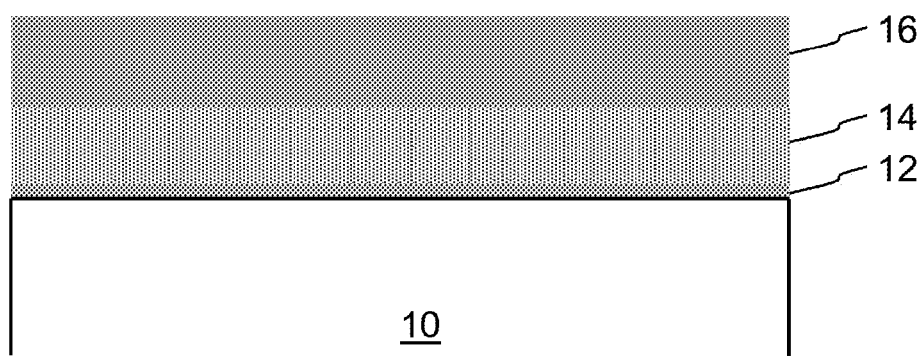

A hard mask layer 16 (HM) of insulation material is formed on the poly layer 14, as shown in FIG. 2. Preferable the hard mask layer 16 is oxide, such as TEOS, HTO, or other types of CVD oxide. HTO with annealing (such as RTA at 1000 C for 30-60 sec) is preferred due to its lower oxide etching rate at later BOE or DHF clean steps. The hard mask oxide thickness can be about 200-300 Å. The goal is to make the final cell height the same as the core logic gate formed on the same wafer substrate.

Figure 3:
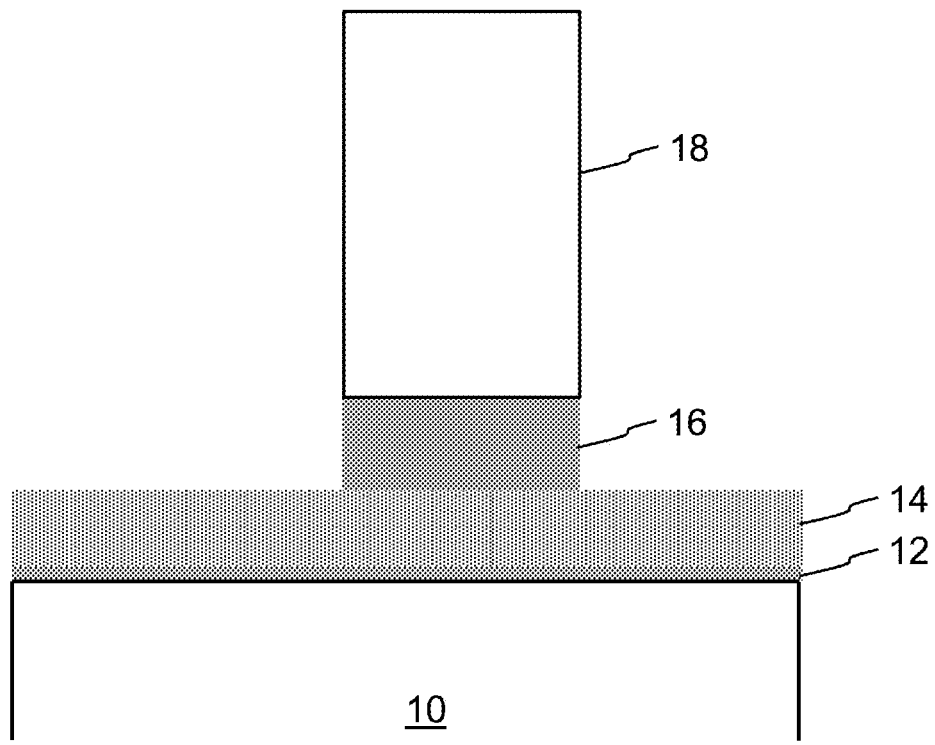

A photolithography masking process is then performed (i.e., a photo resist 18 is deposited, selectively exposed using a mask, and selectively etched away, leaving portions of the underlying material (in this case the hard mask oxide 16) exposed. The exposed portions of hard mask oxide layer 16 are etched using an anisotropic oxide etch, leaving a block of the hard mask oxide 16, as shown in FIG. 3.

Figure 4:
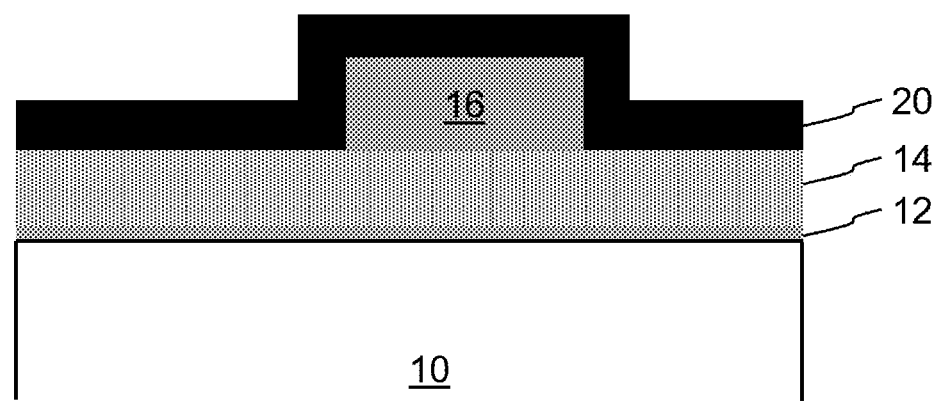
Figure 5:
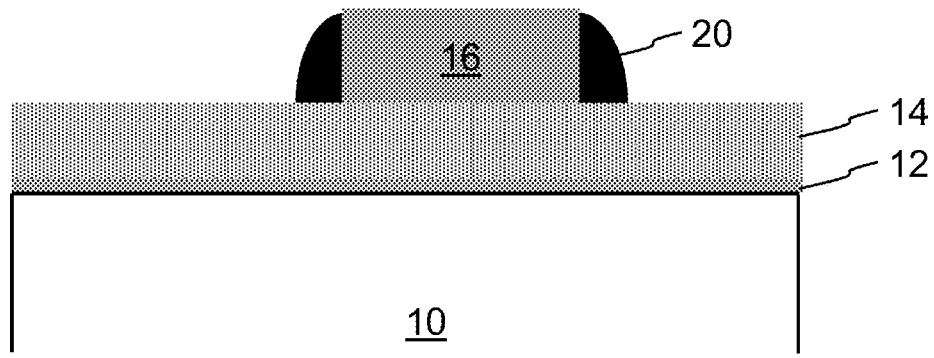
Figure 6:
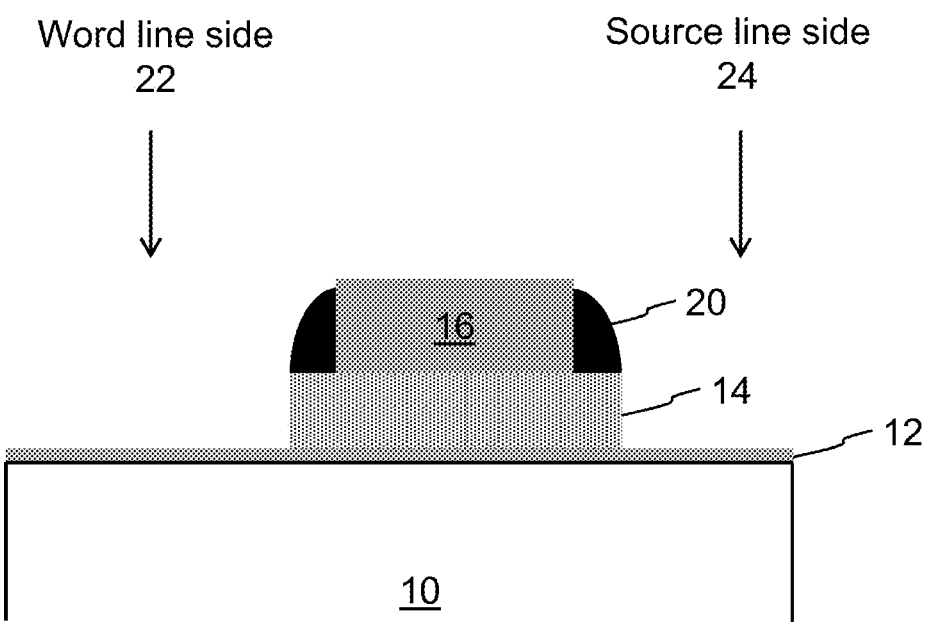

After photo resist 18 is removed, a conformal layer of nitride is then formed over the structure, as shown in FIG. 4. An anisotropic etch is performed to remove the nitride layer except for spacers of the nitride along the sides of the hard mask block 16, as shown in FIG. 5. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). A poly etch (anisotropic) is then performed to remove portions of the poly layer 14 not protected by the nitride spacers 20 and hard mask blocks 16, leaving a block of polysilicon 14, as shown in FIG. 6. The area on one side of the poly block 14 is referred to herein as the word line side 22, and the area on the opposite side of the poly block 14 is referred to herein as the source line side 24.

Figure 7:
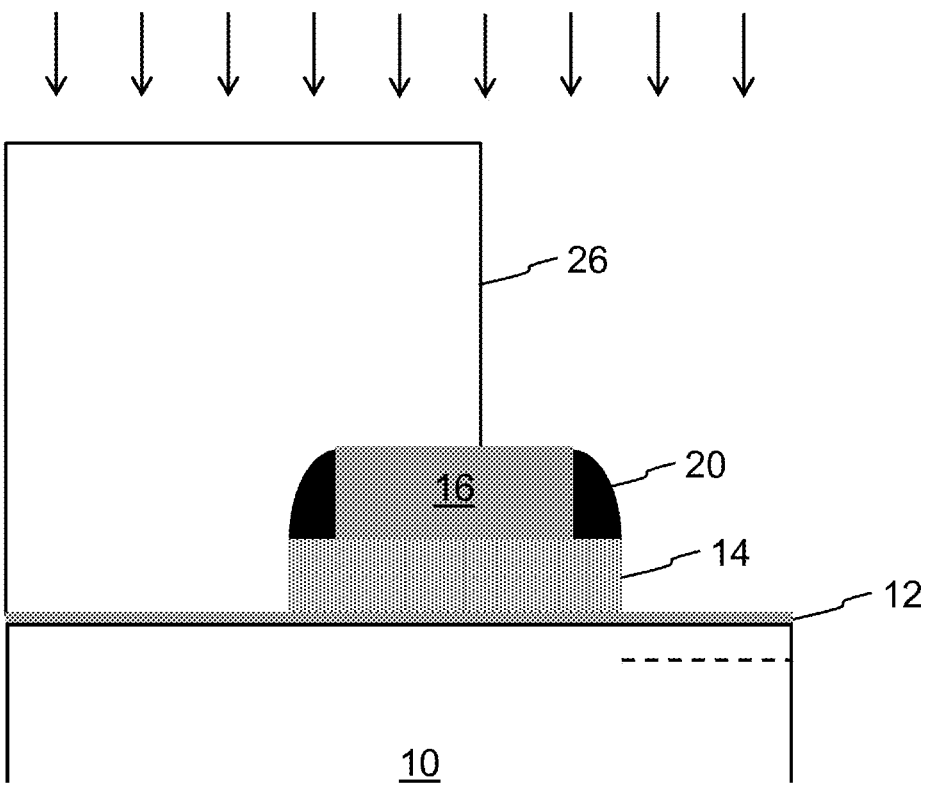
Figure 8:
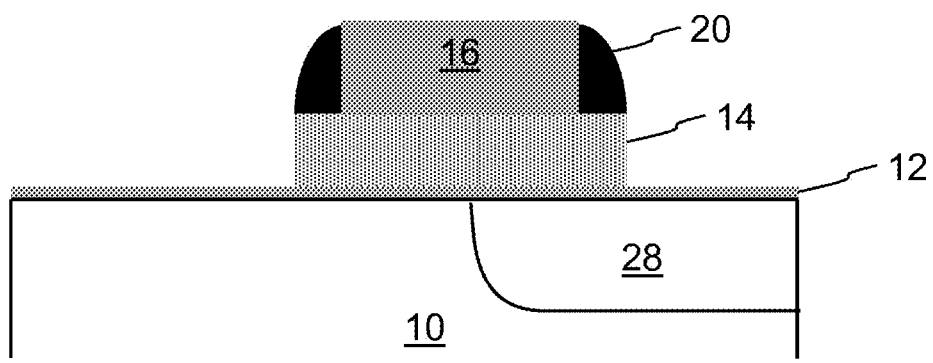

A masking process is then used to form photo resist 26 on the word line side 22 of the poly block 14 and over a portion of HM block 16 (and preferably the periphery areas of the substrate 10 as well), while leaving the source line side 24 exposed. A source line implantation is then performed to implant the substrate 10 on the source line side 24 of the structure, as shown in FIG. 7. The photoresist 26 is removed, and the structure is annealed to finish the formation of the source region 28 (source lines SL), as shown in FIG. 8. It should be noted that source line formation can alternately be performed later in the process flow (e.g., after the poly masking shown in FIG. 15) to fine tune the source line junction.

Figure 9:
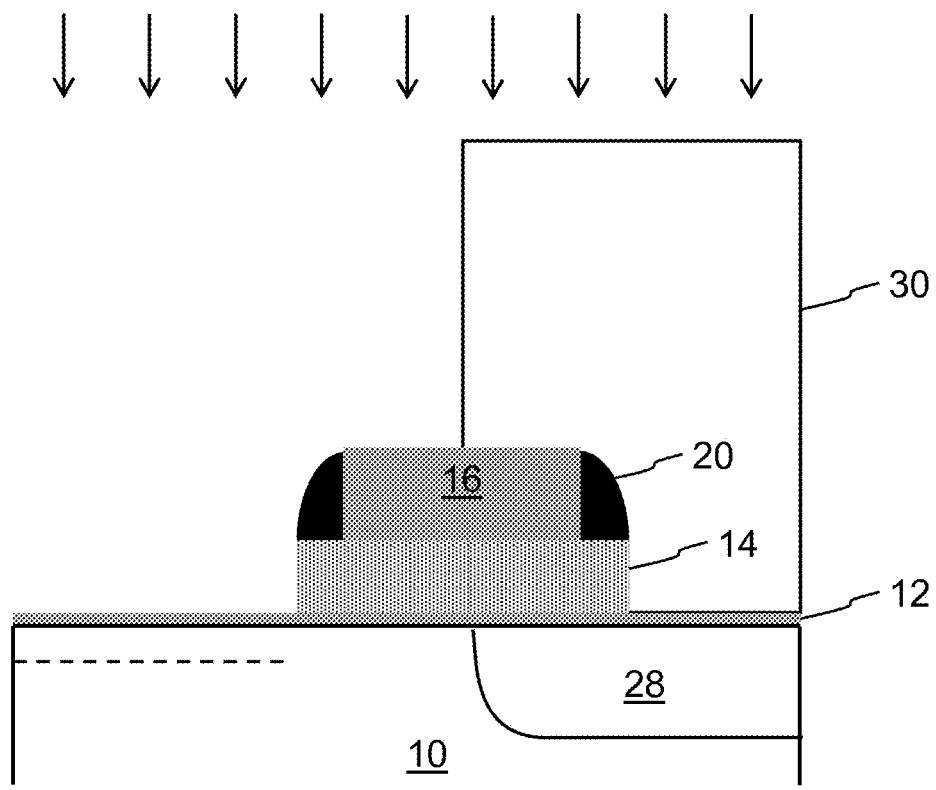

A masking process is then used to form photo resist 30 on the source line side 24 of the structure and over a portion of oxide block 16 (and preferably the periphery areas as well), while leaving the word line side 22 of the structure exposed. An implantation is then performed to implant the substrate on the word line side 22 of the structure, as shown in FIG. 9. The purpose of this implantation is for the threshold voltage of the control gate 36.

Figure 10:
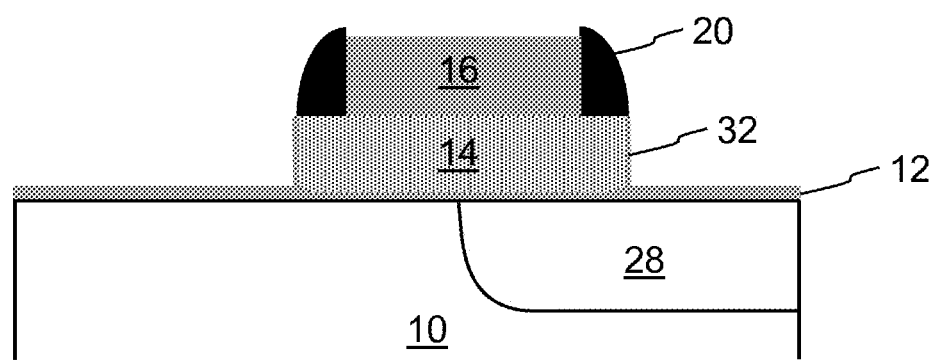
Figure 11:
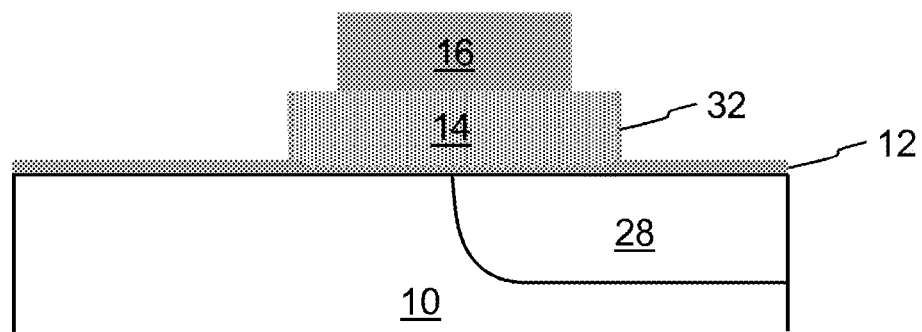

After the photo resist 30 is removed, an oxidation process is used to oxidize the exposed sidewalls of the poly block 14, forming a thin oxide layer 32 having the thickness preferably between 10 to 30 Å, as shown in FIG. 10. The oxide layer 32 shown on the left side of poly block 14 in the figures will provide better word line to floating gate isolation. The nitride spacers 20 are then removed using a nitride etch, as illustrated in FIG. 11. This leaves oxide block 16 disposed over poly block 14, where oxide block 16 has a width that is less than poly block 14 (i.e. portions of poly block 14 extend out from either side of oxide block 16), which allows for the formation of the control gate that wraps around one of the exposed corners of poly block 14. The nitride spacers 20 can be removed for example by wet etching, such as with hot phosphoric acid. The nitride-to-oxide etching selectivity is very high, usually >100:1. This means there will be minimal oxide loss during nitride spacer removal. The remaining oxide 12 on the word line side 22 of the substrate 10 will be kept on the silicon substrate so that the overall thickness here will exceed the tunnel oxide thickness formed in the next step. At this stage, oxide 12 is preferably about 50 Å thick.

Figure 12:
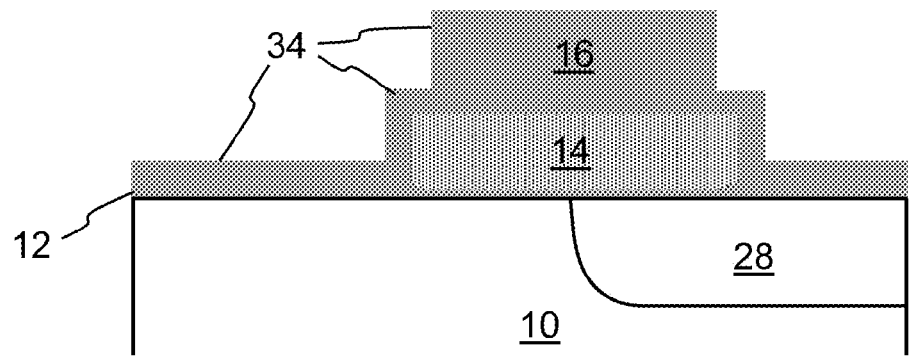

A tunnel oxide layer 34 is formed on the entire structure (e.g. by HTO deposition) as shown in FIG. 12. Specifically, the tunnel oxide layer 34 is formed on the exposed corners of the poly block 14, on the sides and top of oxide block 16, and on oxide 12 (i.e., it thickens the total oxide on the word line side 22 of the substrate surface). For example, if the tunnel oxide 36 is around 120 Å thick and the remaining oxide 12 is around 50 Å thick, then the total oxide on the word line side 22 of the substrate is around 170 Å thick. Having the total oxide on the word line side 22 of the substrate be thicker than the tunnel oxide 34 at the corners of poly block 14 allows a higher voltage to be applied to the word line during the erase operation.

Figure 13:
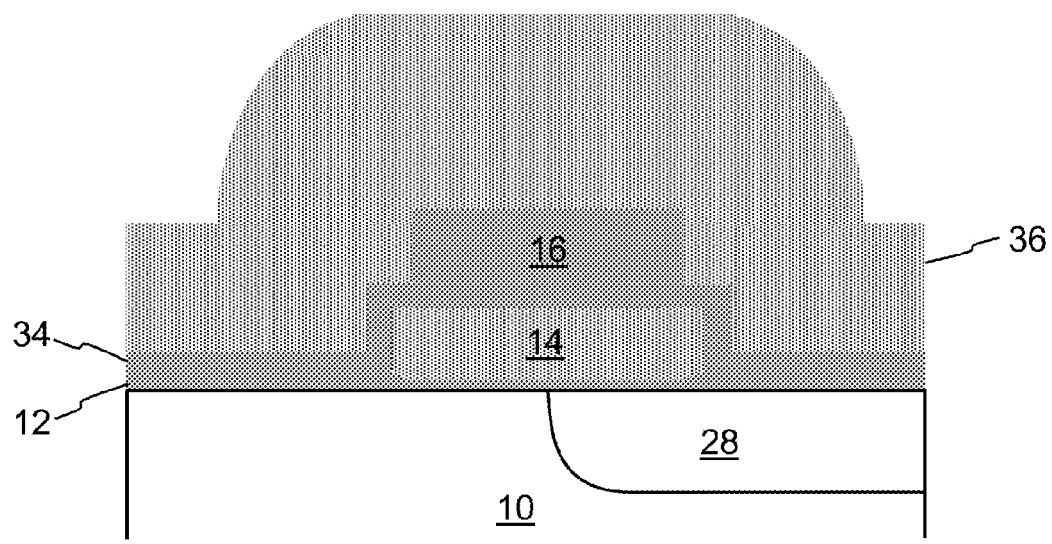
Figure 14:
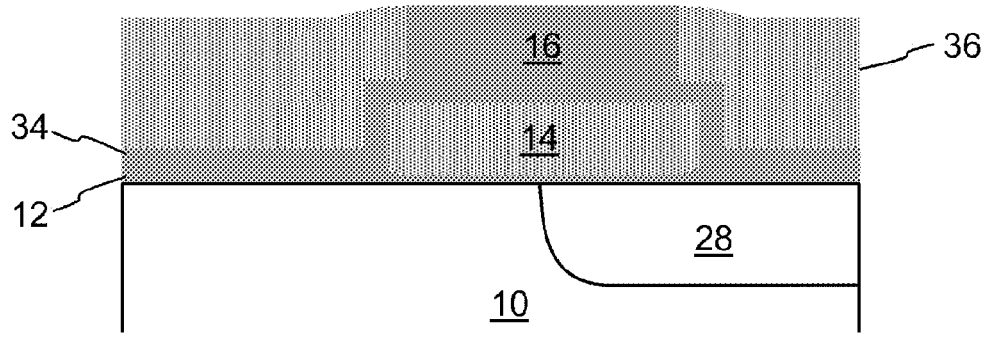
Figure 15:
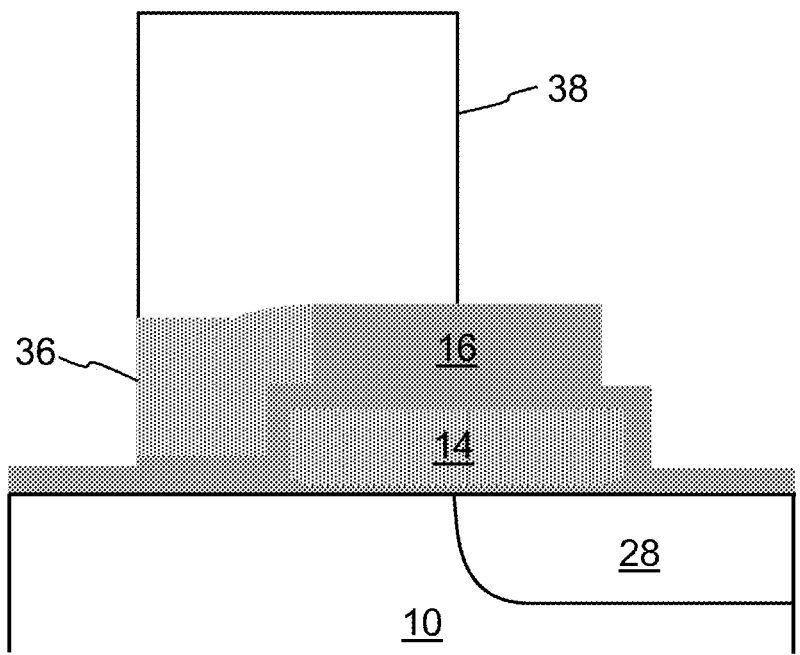
Figure 16:
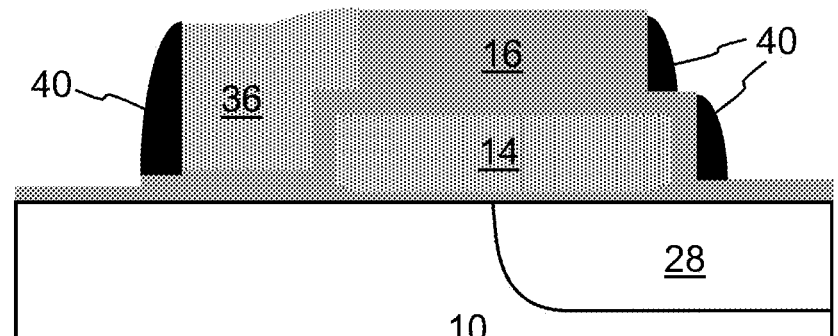
Figure 17:
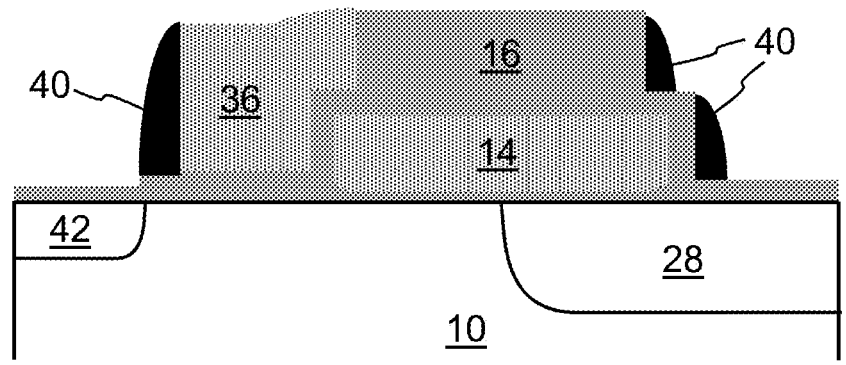

A poly layer 36 is deposited over the structure, followed by a poly implant and anneal, as shown in FIG. 13. A poly chemical mechanical polish (CMP) is performed to planarize the upper surface of poly layer 36 roughly even with the upper surface of the HM oxide block 16, as shown in FIG. 14. A masking step is performed to form photo resist 38 over a portion of the poly layer 36 on the word line side 22 of the structure. A poly etch is then performed to remove the exposed portions of the poly layer 36 (i.e. remove portions of the poly layer 36 from the source line side 24 of the structure, the peripheral area, and a portion of the word line side 22 of the structure, leaving a block of the poly 36 that will serve as the control gate (also referred to as the word line WL), as shown in FIG. 15. This poly etch defines the lateral edge of the control gate 36 (word line gate). After the photo resist 38 is removed, insulation material is deposited and etched to form insulation spacers 40 (i.e., LDD spacers) along the exposed sides of poly block 36, oxide block 16 and tunnel oxide 34, as shown in FIG. 16. The LDD spacers are preferably composite spacers of oxide/nitride, or of oxide/nitride/oxide. An implantation process is then performed to form drain region 42 (also referred to as bit line region BL) in the substrate adjacent the poly block 36, as shown in FIG. 17.

Figure 18:
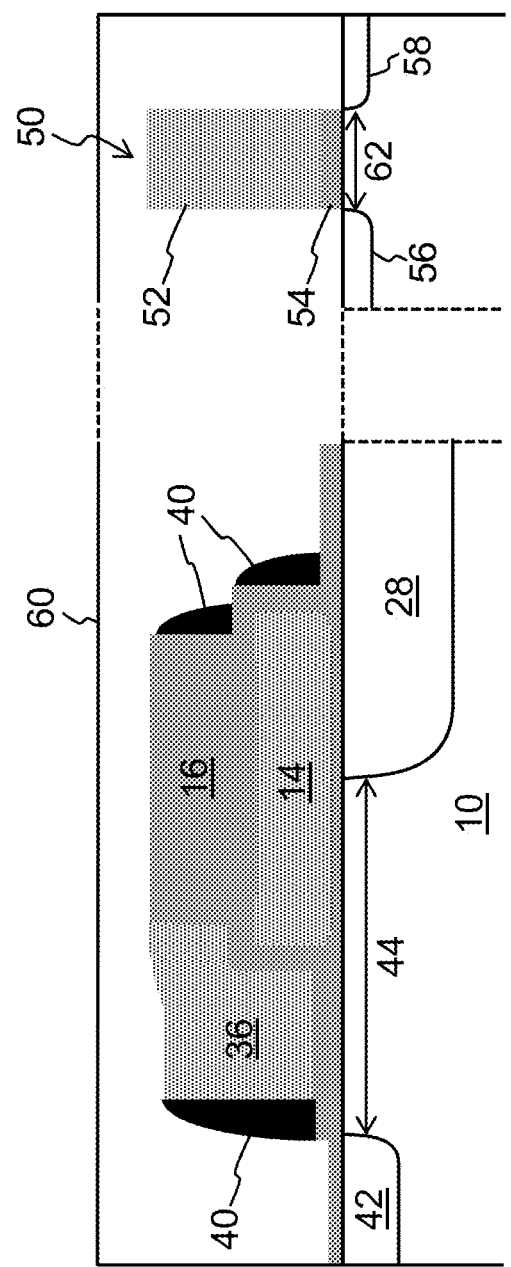

The final reduced height of the memory cells is targeted to be the same as the logic gate height in the logic regions, so that a low profile planarization of ILD insulation over both the memory cells and the logic devices can be more easily achieved. Specifically, logic devices 50 are formed in a different region of the same substrate, as shown in FIG. 18. Each logic device 50 has a conductive logic gate 52 insulated from the substrate 10 by an insulation layer 54, as well as a logic source region 56 and a logic drain region 58 formed in the substrate on either side of the logic gate 52. Logic gate 52 can be formed using the same poly deposition, or a different poly deposition, that is used to form poly block 36. Insulation layer 54 can be formed using the same or different oxide depositions as used to form oxide layers for the memory cells. Logic source/drain regions 56/58 can be formed by the same or different implantations that were used to form drain regions 42. ILD insulation 60 is formed over the structures, and then planarized, as shown in FIG. 18. Well known backend processing is then performed to form contacts, metals and vias to make the necessary gate, source and/or drain electrical connections through the ILD insulation. An extra masking step may be needed to cover and protect the memory array from possible damage by metal CMP.

As shown in FIG. 18, the final memory cell structure include source region 28 and drain region 42 formed in the substrate 10, with a channel region 44 extending there between. A floating gate 14 is disposed over and insulated from a first portion of the channel region (for controlling its conductivity) and a portion of the source region 28. A control gate 36 includes a lower portion that is disposed over and insulated from a second portion of the channel region (for controlling its conductivity) and an upper portion that extends up and over the floating gate 14 (i.e., wraps around the upper corner edge of floating gate 14 and is insulated therefrom by tunnel oxide 34). The logic device includes source region 56 and drain region 58 formed in the substrate 10, with a channel region 62 extending there between. A logic gate 52 is disposed over and insulated from the channel region 62 (for controlling its conductivity). The reduced height of the memory cells means that the top surfaces of the control gate 36 and/or oxide block 16 have approximately the same height over the planar substrate surface as that of the top surface of the logic gate 52 of the logic device.

The above described method reduces the number of masks needed during fabrication, and eliminates the need of more critical process modules typically found in conventional fabrication process flows (e.g. floating gate poly CMP, additional sidewall spacers, etc.).

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated, but rather in any order that allows the proper formation of the memory cells of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
    forming a first insulation layer on a semiconductor substrate;
    forming a layer of conductive material on the first insulation layer;
    forming an insulation block on the layer of conductive material;
    forming an insulation spacer along a side surface of the insulation block and on the layer of conductive material;
    etching the layer of conductive material to form a block of the conductive material disposed directly under the insulation block and the insulation spacer;
    removing the insulation spacer, leaving exposed a portion of a top surface and an upper edge of the block of the conductive material;
    forming a second insulation layer having a first portion wrapping around the exposed upper edge of the block of the conductive material and a second portion disposed on a first portion of the first insulation layer laterally adjacent to the block of the conductive material;
    forming a conductive block having a first portion disposed over the second insulation layer second portion and the first insulation layer, and a second portion that extends up and over the block of the conductive material, wherein the conductive block first portion is laterally adjacent to and insulated from the block of the conductive material, and wherein the conductive block extends along the first portion of the second insulation layer; and
    forming spaced apart source and drain regions in the semiconductor substrate, with a channel region extending there between, wherein the block of the conductive material is disposed over a first portion of the channel region and the source region, and wherein the first portion of the conductive block is disposed over a second portion of the channel region and insulated therefrom by the first insulation layer and the second insulation layer.

2. The method of claim 1, further comprising:
    oxidizing a side surface of the block of the conductive material before the forming of the second insulation layer to form a third insulation layer extending along the side surface, wherein the forming of the second insulation layer includes forming a portion of the second insulation layer extending along the third insulation layer.

3. The method of claim 2, wherein the side surface of the block of conductive material faces the conductive block.

4. The method of claim 2, wherein:
    the second portion of the conductive block is insulated from the portion of the top surface of the block of conductive material by the second insulation layer, and not by the first insulation layer and not by the third insulation layer; and
    the first portion of the conductive block is insulated from the substrate by the first insulation layer and the second insulation layer, and not by the third insulation layer.

5. The method of claim 4, wherein the first portion of the conductive block is insulated from the block of conductive material by the second insulation layer and the third insulation layer, and not by the first insulation layer.

6. The method of claim 1, wherein:
    the second portion of the conductive block is insulated from the portion of the top surface of the block of conductive material by the second insulation layer, and not by the first insulation layer; and
    the first portion of the conductive block is insulated from the substrate by the first insulation layer and the second insulation layer.

7. The method of claim 1, wherein all insulation separating the first portion of the conductive block and the substrate is thicker than all insulation separating the second portion of the conductive block and the portion of the top surface of the block of conductive material.

8. The method of claim 1, wherein the removing of the insulation spacer includes reducing a thickness of the first portion of the first insulation layer.

9. The method of claim 1, further comprising:
    forming spaced apart second source and second drain regions in the semiconductor substrate, with a second channel region extending there between;
    forming a second conductive block over and insulated from the second channel region;

wherein a top surface of the second conductive block has a height relative to a surface of the substrate that is substantially equal to that of a top surface of the conductive block.

10. The method of claim 1, further comprising:
forming spaced apart second source and second drain regions in the semiconductor substrate, with a second channel region extending there between;
forming a second conductive block over and insulated from the second channel region;
wherein a top surface of the second conductive block has a height relative to a surface of the substrate that is substantially equal to that of a top surface of the insulation block.

11. The method of claim 1, further comprising:
forming spaced apart second source and second drain regions in the semiconductor substrate, with a second channel region extending there between;
forming a second conductive block over and insulated from the second channel region;
wherein a top surface of the second conductive block has a height relative to a surface of the substrate that is substantially equal to that of a top surface of the insulation block and a top surface of the conductive block.

* * * * *